US010018666B2

(12) United States Patent
Maruyama et al.

(10) Patent No.: US 10,018,666 B2
(45) Date of Patent: Jul. 10, 2018

(54) PARTIAL DISCHARGE MONITORING SYSTEM AND PARTIAL DISCHARGE MONITORING METHOD (71) Applicant: KABUSHIKI KAISHA TOSHIBA, Minato-ku (JP)

(72) Inventors: Shiro Maruyama, Yokohama (JP); Minoru Saito, Kamakura (JP); Takashi Nakajima, Kawasaki (JP); Shin Hasegawa, Yokohama (JP); Hiroyuki Hayata, Yokohama (JP); Toshiyuki Saida, Nerima (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 533 days.

(21) Appl. No.: 14/850,402

(22) Filed: Sep. 10, 2015

(65) Prior Publication Data
US 2015/0377950 A1 Dec. 31, 2015

Related U.S. Application Data (63) Continuation of application No. PCT/JP2014/001553, filed on Mar. 18, 2014.

(30) Foreign Application Priority Data

Mar. 19, 2013 (JP) ................. 2013-056512

(51) Int. Cl.
G01R 31/08 (2006.01)
G01R 31/12 (2006.01)
(Continued)

(52) U.S. Cl.
CPC ......... *G01R 31/1254* (2013.01); *G01R 31/12* (2013.01); *G01R 31/14* (2013.01); *H02B 13/065* (2013.01)

(58) Field of Classification Search
CPC .... G01R 31/12; G01R 31/14; G01R 31/1254; G01R 31/02; G01R 31/1272;
(Continued)

(56) References Cited

U.S. PATENT DOCUMENTS 5,396,180 A     3/1995  Hampton et al.
6,483,316 B2 * 11/2002  Kato ............... G01R 31/1254
                                                     324/122
(Continued)

FOREIGN PATENT DOCUMENTS

CN     101490573 A    7/2009
JP     08-005698 A    1/1996
(Continued)

OTHER PUBLICATIONS

International Search Report dated May 20, 2014 for PCT/JP2014/001553 filed on Mar. 18, 2014 with English Translation.
(Continued)

*Primary Examiner* — Thang Le
(74) *Attorney, Agent, or Firm* — Oblon, McClelland, Maier & Neustadt, L.L.P.

(57) ABSTRACT

A partial discharge monitoring system includes: electromagnetic wave detection sensors disposed in insulating gas enclosures being objects to be monitored, converting devices, and an interface device. The interface device includes: a detecting part detecting a zero cross point of a voltage signal synchronous with a voltage signal applied to conductors disposed in the insulating gas enclosures, and deciding a sampling timing of signals of electromagnetic waves; a transmitting part notifying the sampling timing decided by the detecting part to the converting devices; an integrating part integrating digital data which are received
(Continued)

from the converting devices on per converting device basis; and a transmitting part transmitting the integrated digital data to a monitoring device.

8 Claims, 6 Drawing Sheets

(51) Int. Cl.
*G01R 31/14* (2006.01)
*H02B 13/065* (2006.01)

(58) Field of Classification Search
CPC .... G01R 31/1281; G01R 31/08; G01R 31/11; G01R 31/16; G01R 31/28; G01R 31/085; H02B 13/065
USPC ....... 324/536, 533, 544, 551, 555, 557, 541, 324/382, 403, 409, 678, 76.65, 87, 76.32, 324/12, 76.34, 5, 76.67, 71, 76.76, 45, 324/237, 238, 216, 240, 123 R, 122, 512, 324/718, 456
See application file for complete search history.

(56) References Cited

U.S. PATENT DOCUMENTS

| | | | |
|---|---|---|---|
| 2005/0184737 A1* | 8/2005 | Moriyama | G01R 31/1254 324/536 |
| 2006/0132144 A1* | 6/2006 | Kato | G01R 31/085 324/536 |
| 2007/0290692 A1 | 12/2007 | Peck et al. | |
| 2011/0080161 A1* | 4/2011 | Maruyama | G01R 31/1254 324/122 |

FOREIGN PATENT DOCUMENTS

| | | |
|---|---|---|
| JP | 11-101844 A | 4/1999 |
| JP | 11-352179 A | 12/1999 |
| JP | 2003-043095 A | 2/2003 |
| JP | 2007-232495 A | 9/2007 |
| JP | 2009-541740 A | 11/2009 |
| JP | 2010-276551 A | 12/2010 |
| JP | 2011-095036 A | 5/2011 |
| KR | 10-2009-0054423 A | 5/2009 |
| WO | WO 2007/149205 A2 | 12/2007 |

OTHER PUBLICATIONS

Written Opinion dated May 20, 2014 for PCT/JP2014/001553 filed on Mar. 18, 2014.
English translation of the International Preliminary Report on Patentability dated Oct. 1, 2015 in PCT/JP2014/001553.
Written Opinion dated May 20, 2014 in PCT/JP2014/001553 (previously filed Sep. 10, 2015, submitting English translation only).
Office Action dated Feb. 21, 2017 in Japanese Patent Application No. 2013-058512 (with unedited computer generated English translation).

* cited by examiner

FIG. 1

2: COAXIAL CABLE
3a: CONVERTING DEVICE
5: MONITORING BOARD
41: METAL CONTAINER
42: HIGH-VOLTAGE CONDUCTOR
46: FLANGE

FIG. 2

1: SENSOR
2: COAXIAL CABLE
41: METAL CONTAINER
43: DEFECTIVE PORTION
44: INSULATING SPACER
46: FLANGE
47: ANTENNA

PARTIAL DISCHARGE MONITORING SYSTEM AND PARTIAL DISCHARGE MONITORING METHOD

CROSS REFERENCE TO RELATED APPLICATION

This application is a continuation of prior International Application No. PCT/JP2014/001553 filed on Mar. 18, 2014, which is based upon and claims the benefit of priority from Japanese Patent Application No. 2013-056512 filed on Mar. 19, 2013; the entire contents of all of which are incorporated herein by reference.

FIELD

Embodiments described herein relate generally to a partial discharge monitoring system and a partial discharge monitoring method.

BACKGROUND

Gas-insulated apparatuses such as gas-insulated switchgears such as GIS, gas-insulated buses, and gas-insulated transformers are generally used in power facilities such as, for example, substations. The gas-insulated apparatus is an apparatus in which high-voltage conductors are housed in hermetic metal containers filled with insulating gas and the high-voltage conductors are supported by insulators. It is known that, when a defective portion with a contact failure, the mixture of metal foreign matter, or the like is generated inside the metal container in this gas-insulated apparatus, a partial discharge occurs from the defective portion.

Leaving the partial discharge in the gas-insulated apparatus as it is soon leads to dielectric breakdown, which has a possibility to develop into the occurrence of a serious accident. Therefore, it is important to prevent the serious accident by discovering the partial discharge at an early stage and taking some measure such as repairing the defective portion.

Here, as a preventive maintenance technique for an insulation diagnosis of a gas-insulated apparatus, there has been proposed a partial discharge monitoring system including: a plurality of partial discharge detecting units which detect a partial discharge inside the gas-insulated apparatus; and a data processing device which monitors partial discharge signals from the respective partial discharge detecting units via a ring network.

In the case of the conventional partial discharge monitoring system and partial discharge monitoring method, since the partial discharge signals from the respective partial discharge detecting units are constantly sent to the network, a load is given to the network, and a continuous increase of data may cause a trouble in the communication of the network.

DETAILED DESCRIPTION

A partial discharge monitoring system of an embodiment includes electromagnetic wave detection sensors disposed in insulating gas enclosures being objects to be monitored, converting devices, and an interface device. The electromagnetic wave detection sensors detect electromagnetic waves in the insulating gas enclosures. The converting devices sample signals of the electromagnetic waves detected by the electromagnetic wave detection sensors and convert the signals to digital data. The interface device integrates the digital data generated through the conversion by the converting devices and transmits the integrated digital data to a monitoring device. The interface device includes: a detecting part detecting a zero cross point of a voltage signal synchronous with a voltage signal applied to conductors disposed in the insulating gas enclosures and deciding a sampling timing of the signals of the electromagnetic waves; a transmitting part notifying the sampling timing decided by the detecting part to the converting devices; an integrating part integrating the digital data which are received from the converting devices on per converting device basis; and a transmitting part transmitting the digital data integrated by the integrating part to the monitoring device. The converting devices each include: a timing deciding part deciding a timing when to sample the signal of the electromagnetic wave, based on the sampling timing notified from the interface device; a detecting part sampling the signal of the electromagnetic wave based on the timing decided by the timing deciding part, and converting the signal to the digital data; and a transmitting part transmitting the digital data generated through the conversion by the detecting part to the interface device.

Figure 1:
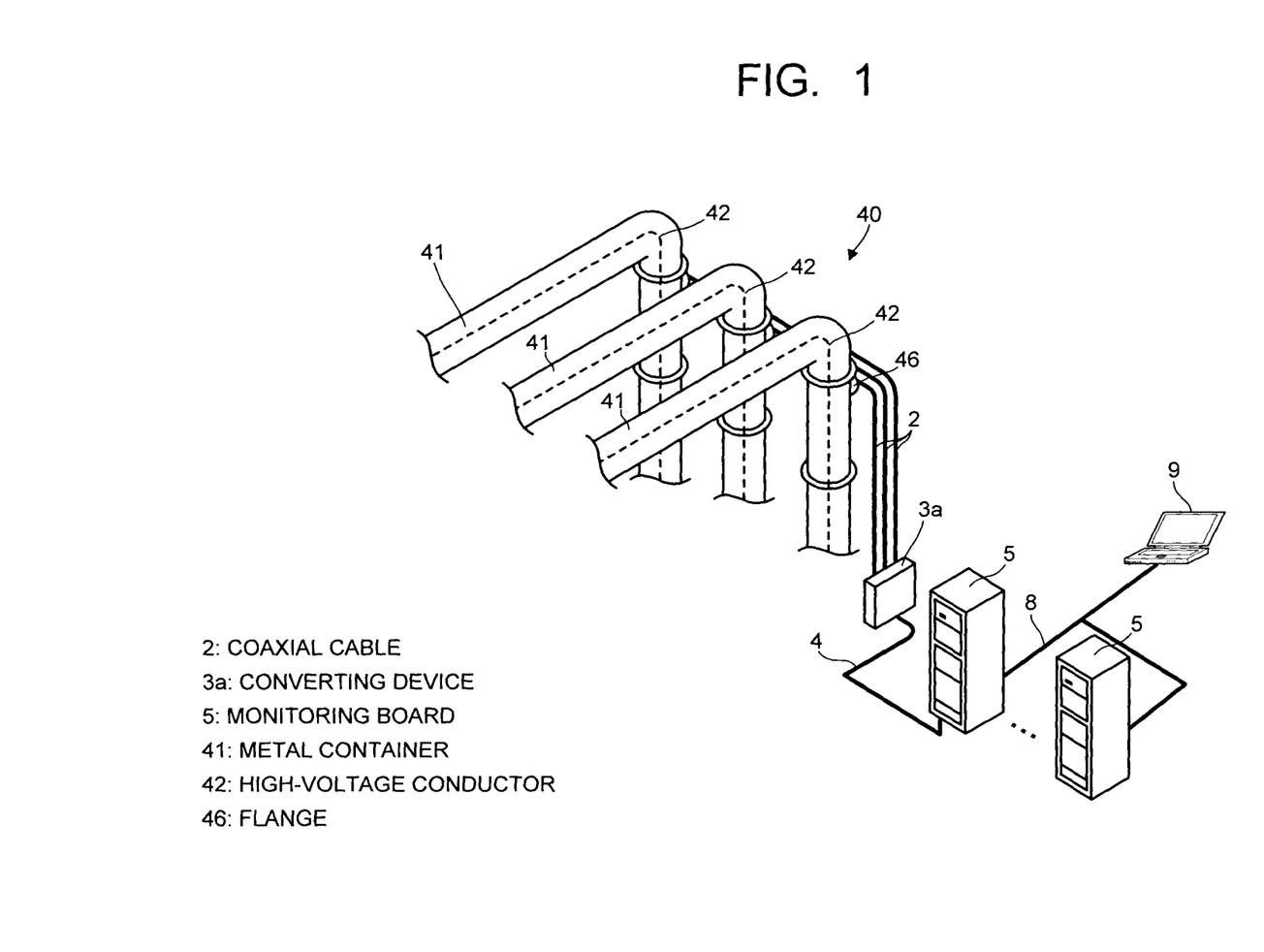
FIG. 1 is a view illustrating a schematic structure of a partial discharge monitoring system of an embodiment.
Figure 2:
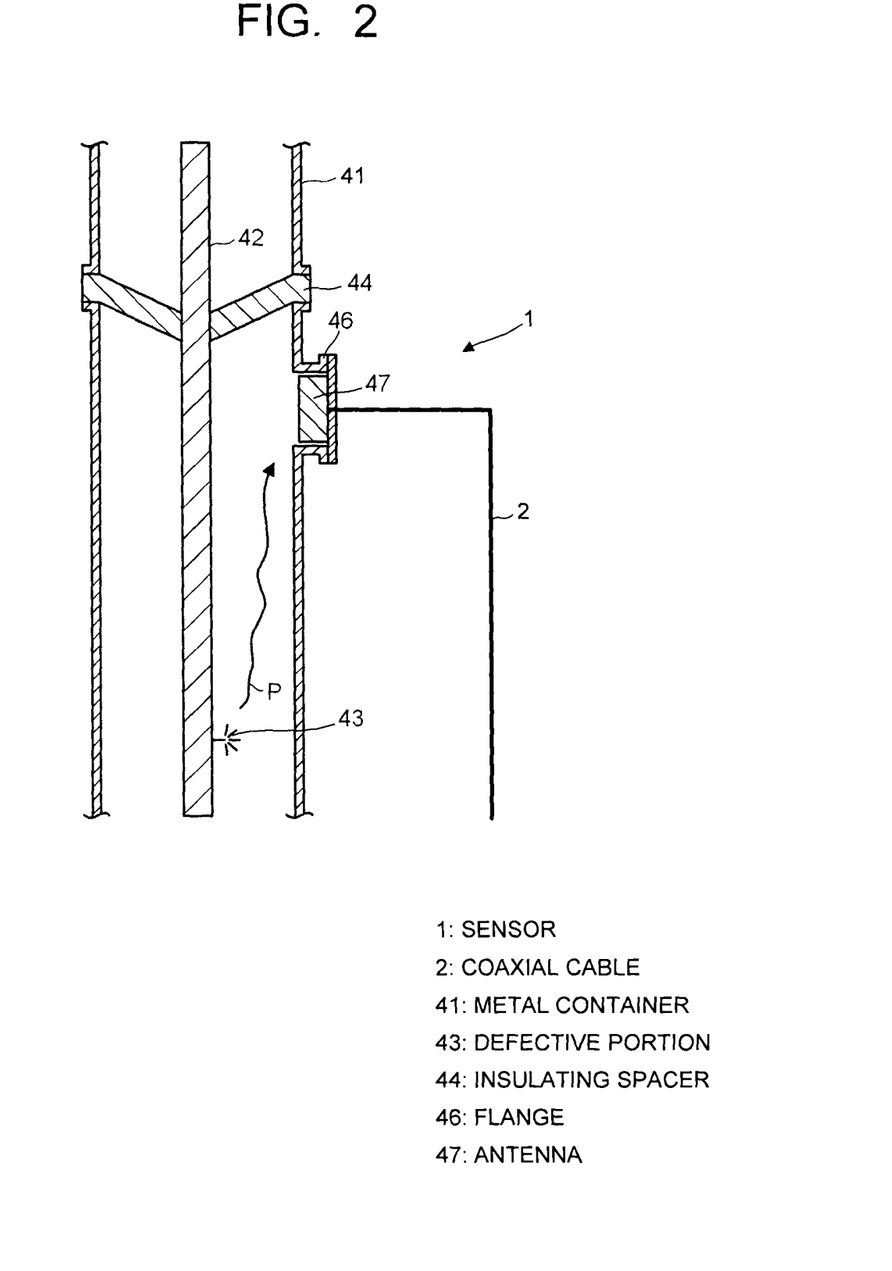
FIG. 2 is a cross-sectional view illustrating an inner structure of GIS.
Figure 3:
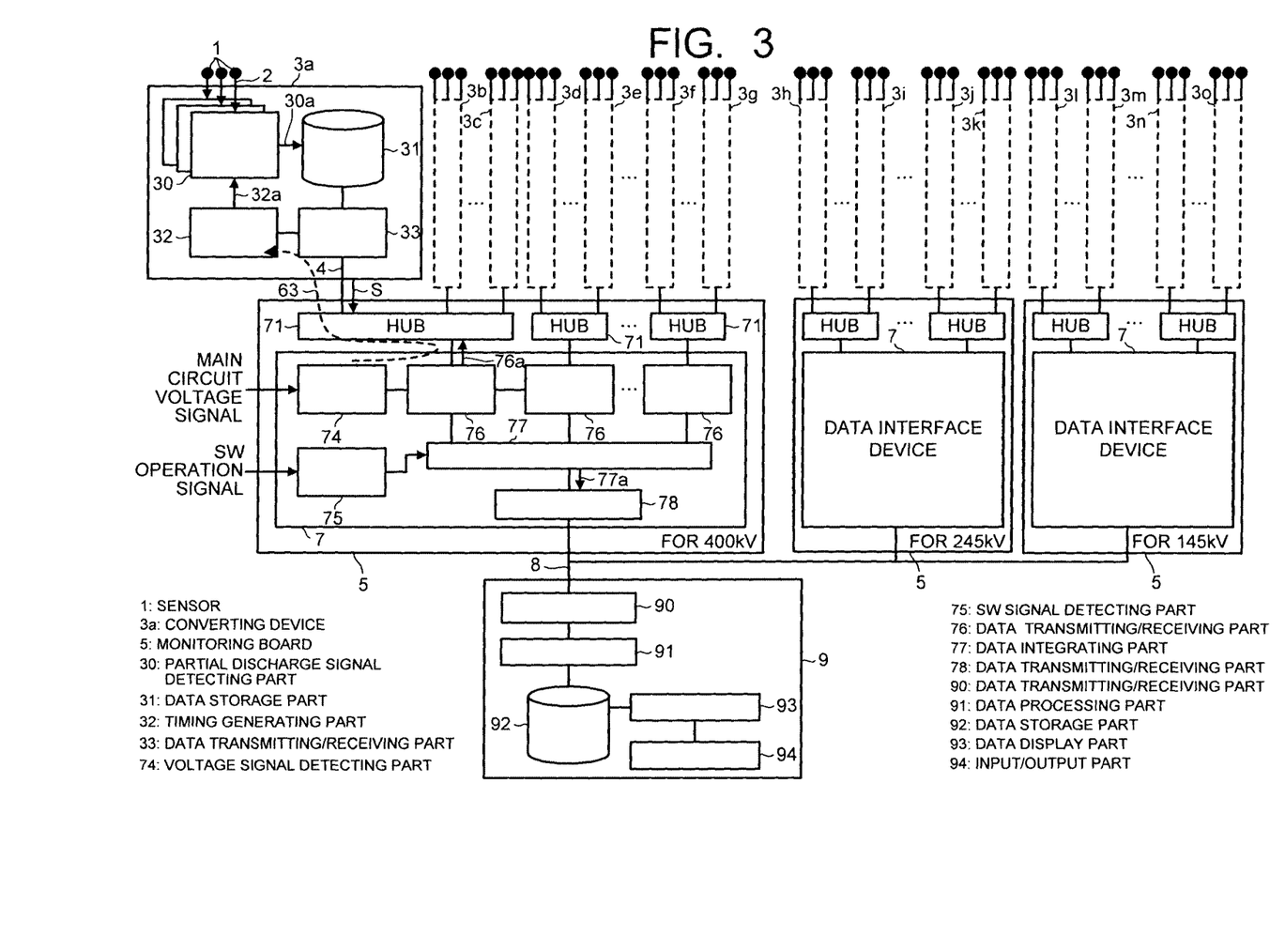
FIG. 3 is a block diagram illustrating the structure of the partial discharge monitoring system.

Hereinafter, an embodiment will be described in detail with reference to the drawings. FIG. 1 is a view illustrating a schematic structure of a partial discharge monitoring system of the embodiment, FIG. 2 is a view illustrating an inner structure of GIS, and FIG. 3 is a block diagram illustrating the structure of each part of the partial discharge monitoring system. As illustrated in FIG. 1 to FIG. 3, the partial discharge monitoring system of the embodiment includes: a plurality of electromagnetic wave detection sensors 1 (hereinafter referred to as the "sensors 1") as partial discharge detectors provided in metal containers 41 (insulating gas enclosures) in a cylindrical tube shape which are pipes of a plurality of gas-insulated switchgears (GIS); converting devices 3a to 3o connected to the plural sensors 1 via coaxial cables 2 or the like; monitoring boards 5 connected to the converting devices 3a to 3o via a network such as LAN 4 or the like; and a computer 9 (hereinafter referred to as the "PC 9") as a monitoring device and a data processing device connected to the plural monitoring boards 5 via a network such as LAN 8 or the like.

The GIS 40 includes the metal containers 41 as the hermetic insulating gas enclosures with a ground potential, high-voltage conductors 42, insulating spacers 44, and so on. The metal containers 41 are filled with insulating gas such as SF6 gas, and the high-voltage conductors 42 each are supported by the insulating spacer 44 made of an insulator at a substantially center position of the metal container 41. Inner parts of of the metal containers 41 are objects to be monitored by this system.

The sensors 1 are each a circular plate electrode (antenna 47) which detects an electromagnetic wave P in the metal container 41, and are each installed on a flange 46 of a handhole being a hole for inner access with a relatively low field intensity, of the metal container 41. The sensors 1 are provided for an A phase, a B phase, and a C phase respectively in a case where a signal of electric power fed by the GIS 40 is, for example, a three-phase AC signal.

That is, the sensors 1 each are a sensor which detects a partial discharge occurring in the metal container 41 and outputs a detection signal. Since the electromagnetic wave P accompanying the partial discharge includes signals ranging from several ten MHz to several GHz, the sensors 1 detect electromagnetic wave signals in a UHF band (300 MHz to 3 GHz).

The plural converting devices 3a to 3o each include a partial discharge signal detecting part 30, a data storage part 31, a timing generating part 32, a data transmitting/receiving part 33, and so on. The data storage part 31 is a memory or the like for temporarily holding data. The converting devices 3a to 3o are installed near the metal containers 41 of the GIS 41.

The converting devices 3a to 3o each detect the signals of the sensors 1 at intervals of each segment into which a sampling time period is divided based on a zero cross timing of a phase of a main circuit voltage signal which timing is detected by the data interface device 7.

In the case of the three-phase AC signal, since it is convenient to collectively process the signals of the three sensors 1, the converting devices 3a to 3o each detect the detection signals of the sensors 1 at intervals of each segment into which one cycle is divided by a multiple of three based on a phase timing of the main circuit voltage signal detected by the data interface device 7.

The partial discharge signal detecting part 30 samples state signals (state quantities) for 50 cycles received from the sensors 1, with the period and the number of division being set as desired (for example, at timings obtained by dividing a period of one cycle by 60 (60/sec)), converts the state signals to digital state data S (refer to FIG. 5), and stores the state data S in the data storage part 31.

The timing generating part 32 generates a timing of timing pulse data sampling received from the data interface device 7.

That is, the timing generating part 32 is a timing deciding part which decides: a timing when to sample the state signals having a possibility of containing the electromagnetic wave; and the number of division of one period of the state signal, based on the sampling timing notified from the data interface device 7.

The data transmitting/receiving part 33 reads the state data S stored in the data storage part 31 and transmits the state data S to the monitoring board 5 via the LAN 4. Specifically, the data transmitting/receiving part 33 transmits the state data S to the data interface device 7 via a HUB 71 of the monitoring board 5.

The monitoring boards 5 each are provided with the HUBs 71 and the data interface device 7. The HUBs 71 each are a device which relays (distributes) the communication of LAN. The HUBs 71 relay the communication between the converting devices 3a to 3g and the data interface device 7.

The monitoring board 5 is provided for each voltage class. In this example, the monitoring boards 5 include those for different three classes, that is, one for 400 kV, one for 245 kV, and one for 145 kV.

The data interface device 7 includes a voltage signal detecting part 74, a SW signal detecting part 75, data transmitting/receiving parts 76, a data integrating part 77, and a data transmitting/receiving part 78. The data interface device 7 is provided for each apparatus to be monitored (in this case, the converting devices 3a to 3g, 3h to 3k, 3l to 3o).

The data interface devices 7 each integrate the data transmitted from the plural ones of the converting devices 3a to 3o into data for each unit time and transmit the resultant data to the PC 9. The data interface devices 7 control the timing of the data transmission/reception to/from the converting devices 3a to 3o.

The data interface devices 7 each generate a pulse signal at the zero cross timing of the main circuit voltage signal of one phase and transmit the generated pulse signal to the relevant converting devices 3a to 3g, 3h to 3k, or 3l to 3o at predetermined time intervals (for example, at one-second intervals or the like).

The voltage signal detecting part 74 receives a voltage from the main circuit such as a power line of a substation facility (hereinafter referred to as the "main circuit voltage signal") and detects a zero cross timing T (refer to FIG. 4C) from a phase of the main circuit voltage signal. That is, the voltage signal detecting part 74 is a detecting part which detects a zero cross point of the main circuit voltage signal (reference signal) in phase with a voltage signal applied to the high-voltage conductors 42 disposed in the metal containers 41 and decides the sampling timing of the state signals.

The SW signal detecting part 75 detects that the GIS 40 is in operation based on a SW operation signal input from the GIS 40 when the GIS 40 is in operation (for example, when a switch that the GIS 40 has changes from an open state to a closed state), and notifies this as GIS operation information to the data integrating part 77. That is, the SW signal detecting part 75 receives a signal (operation/non-operation flag or the like) notifying that the apparatus to be monitored is in operation, and detects that the apparatus to be monitored is in operation.

The data transmitting/receiving parts 76 perform data transmission/reception (communication) via the LAN 4. The data transmitting/receiving parts 76 notify the sampling timing decided by the voltage signal detecting part 74 to the converting devices 3a to 3g of the same power class. The data transmitting/receiving part 78 performs data transmission/reception (communication) from/to the PC 9 via the LAN 8 as a data transmission line.

The data integrating part 77 integrates the state data S of the plural converting devices 3a to 3g received by the data transmitting/receiving parts 76 and the GIS operation information input from the SW signal detecting part 75, and gives the resultant to the data transmitting/receiving part 78.

The data integrating part 77 integrates the state data S (digital data) which are received from the converting devices 3a to 3g of the same power class on per converting device basis, into sampling integrated data 77a. That is, the data transmitting/receiving part 78 transmits the sampling integrated data 77a (digital data) generated by the data integrating part 77 by the integration to the PC 9 as the monitoring device.

The PC 9 includes a data transmitting/receiving part 90, a data processing part 91, a data storage part 92, a data display part 93, and an input/output part 94. The data transmitting/receiving part 90 receives the sampling integrated data 77a sent from the data integrating parts 77 of the monitoring boards 5.

The data processing part 91 decomposes the sampling integrated data 77*a* received by the data transmitting/receiving part 90 into one-second data of the single sensor 1, and stores the data in the data storage part 92 and also outputs a generation pattern of the partial discharge signal to the data display part 93 to make it displayed on a screen of a monitor. In this case, the generation pattern of the partial discharge signal is displayed as a graph, with a horizontal axis representing an electrical angle 0 to 360° C. of the voltage. The one-second data of each of the sensors 1 is stored in the data storage part 92 as required.

The data display part 93 displays the generation pattern of the partial discharge signal processed by the data processing part 91, on the screen of the monitor. The input/output part 94 includes an input part such as a keyboard and a mouse, an output part which outputs a contact signal, and so on.

Hereinafter, the operation of the partial discharge monitoring system of this embodiment will be described with reference to FIG. 4 to FIG. 6.

Figure 4A:
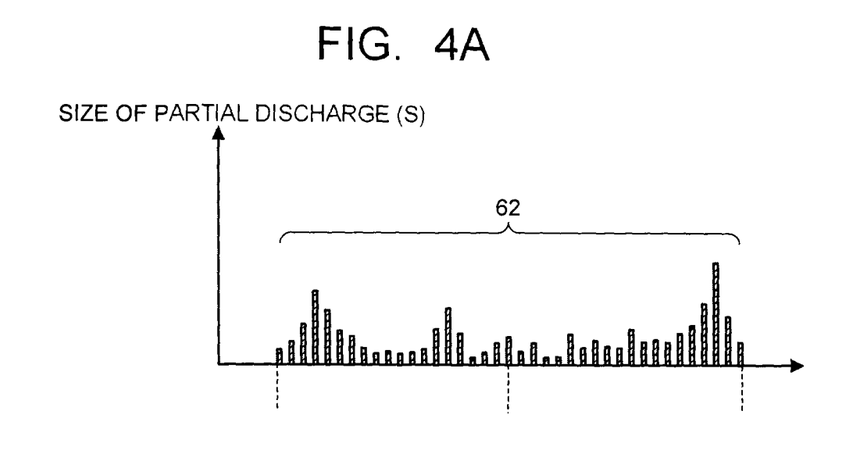
FIG. 4A is a chart illustrating an AC phase-resolved type of a partial discharge signal detected by a sensor.
Figure 4B:
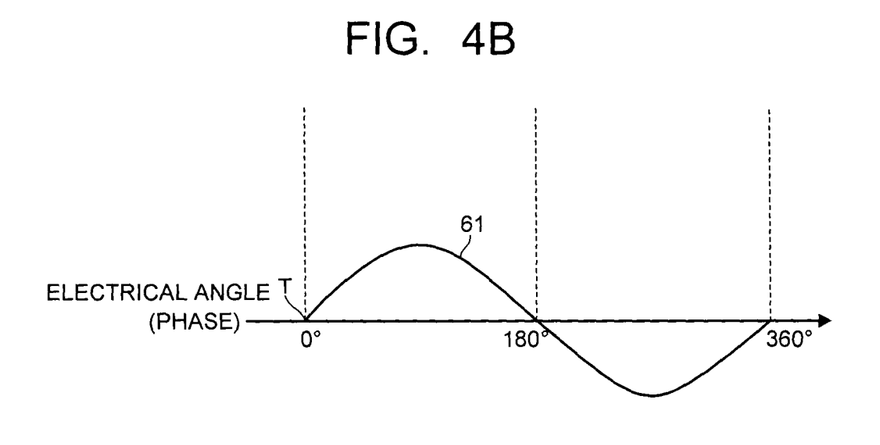
FIG. 4B is a chart illustrating one cycle of a waveform of a main circuit voltage signal.
Figure 4C:
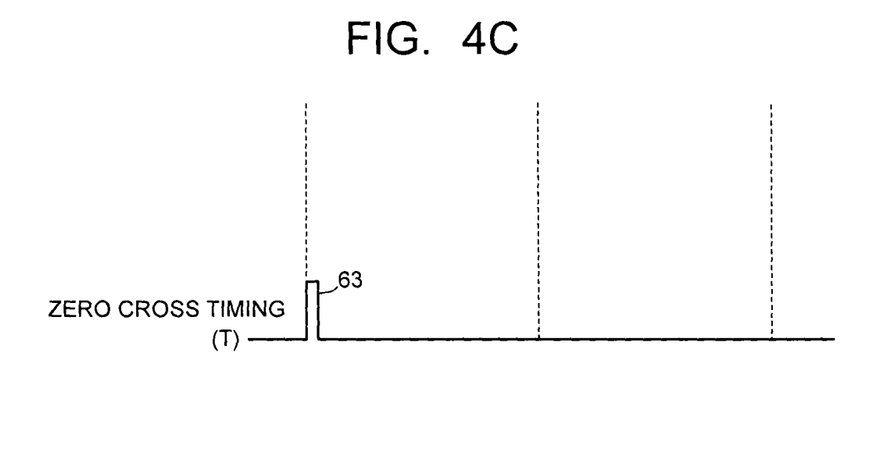
FIG. 4C is a chart illustrating a zero cross timing of the main circuit voltage.
Figure 5:
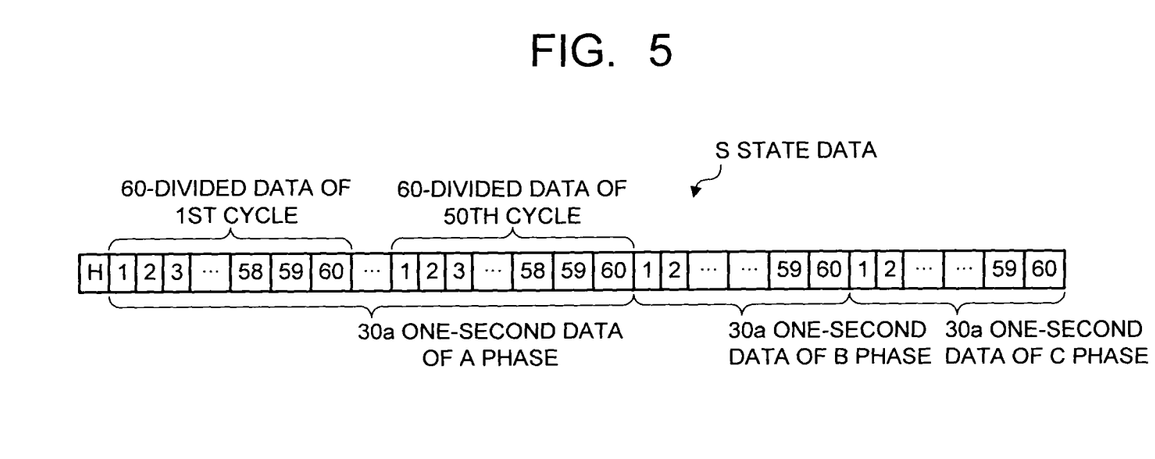
FIG. 5 is a chart illustrating state data S resulting from conversion by a converting device.

FIG. 4A is a chart illustrating a pattern of an AC phase-resolved type of the partial discharge signal detected by the sensor 1, FIG. 4B is a chart illustrating one cycle of the main circuit voltage signal, and FIG. 4C is a chart illustrating the zero cross timing of the main circuit voltage. Note that FIG. 4B illustrates a signal 61 corresponding to one cycle of the voltage from the main circuit such as the power line of the substation facility (hereinafter referred to as the "main circuit voltage signal"), with the horizontal axis representing the electrical angle 0 to 360° of the voltage.

As illustrated in FIG. 4A, a magnitude of the main circuit voltage signal 61 is displayed as a pattern 62 decomposed and visualized based a generated phase. This pattern 62 changes when the partial discharge occurs in the metal container 41 and thus becomes a pattern indicating a characteristic corresponding to a cause of the partial discharge.

In the data interface device 7, the reference signal (main circuit voltage signal) in phase with the signal of the object to be monitored in which the sensor 1 is installed is input to the voltage signal detecting part 74.

In the case of the partial discharge monitoring system of this embodiment, the voltage signal detecting part 74 detects the zero cross timing T of the main circuit voltage signal from the main circuit voltage signal (refer to FIG. 4B) input to the data interface device 7, and outputs a timing pulse 63 (refer to FIG. 4C) at the detection timing at regular time intervals (for example, at one-second intervals).

That is, the voltage signal detecting part 74 detects the timing T at which the main circuit voltage signal 61 illustrated in FIG. 4B crosses the zero point, generates the timing pulse 63, and outputs it as zero cross timing data of the main circuit voltage signal 61 to the data transmitting/receiving parts 76.

The data transmitting/receiving parts 76 transmit the received zero cross timing data to the converting devices 3 via the HUBs 71 and the LAN 4.

In each of the converting devices 3*a* to 3*g*, upon receiving the zero cross timing data sent from the data interface device 7, the data transmitting/receiving part 33 gives the received zero cross timing data to the timing generating part 32.

The timing generating part 32 creates a sampling start timing based on the timing pulse 63 of the received zero cross timing data and a number of division of one cycle, and outputs the sampling start timing to the partial discharge signal detecting part 30.

Meanwhile, in the GIS 40, when the partial discharge occurs in a defective portion 43 of the high-voltage conductor 42 in the metal container 41, the electromagnetic wave P with several ten MHz to several ten GHz ascribable to the partial discharge in the metal container 41 is generated. At this time, the electromagnetic wave P propagates in the hermetic metal container 41 according to the waveguide theory. Then, the sensor 1 receives the electromagnetic wave P in the metal container 41.

The partial discharge signal detecting part 30 samples the detection signals input from the sensors 1 of the A phase, the B phase, and the C phase at regular time intervals. At this time, the partial discharge signal detecting part 30 starts the sampling based on the sampling start timing generated by the timing generating part 32, and generates sampling data strings 30*a* for a certain period of time as illustrated in FIG. 5.

At this time, the partial discharge signal detecting part 30 combines the sampling data strings 30*a* obtained from the plural sensors 1 and stores the resultant as sampling combined data (hereinafter referred as the "state data S") in the data storage part 31. The state data S stored in the data storage part 31 is sent to the data interface device 7 of the monitoring board 5 from the data transmitting/receiving part 33 via the LAN 4 and the HUB 71 at regular time intervals, for example, at one-second intervals.

That is, in each of the converting devices 3*a* to 3*o*, the detection signals are obtained from the respective sensors 1, the obtained detection signals (state quantities of the signals) are sampled (digitally sampled) based on an input timing of the timing signal received from the data interface device 7, the resultants are converted to the digital state data S, the state data S is stored in the data storage part 31, and thereafter the data transmitting/receiving part 33 reads the state data S in the data storage part 31 and transmits it to the data interface device 7 via the LAN 4.

In the data interface device 7, the data transmitting/receiving parts 76 receive the state data S sent via the HUBS 71 and give them to the data integrating part 77.

The data interface device 7 receives the state data S from the plural converting devices 3*a* to 3*g* of the same voltage class (for 400 kV). Further, the SW signal detecting part 75 receives the SW operation signal to detect the state where the GIS 40 is in operation, and notifies it to the data integrating part 77.

Figure 6:
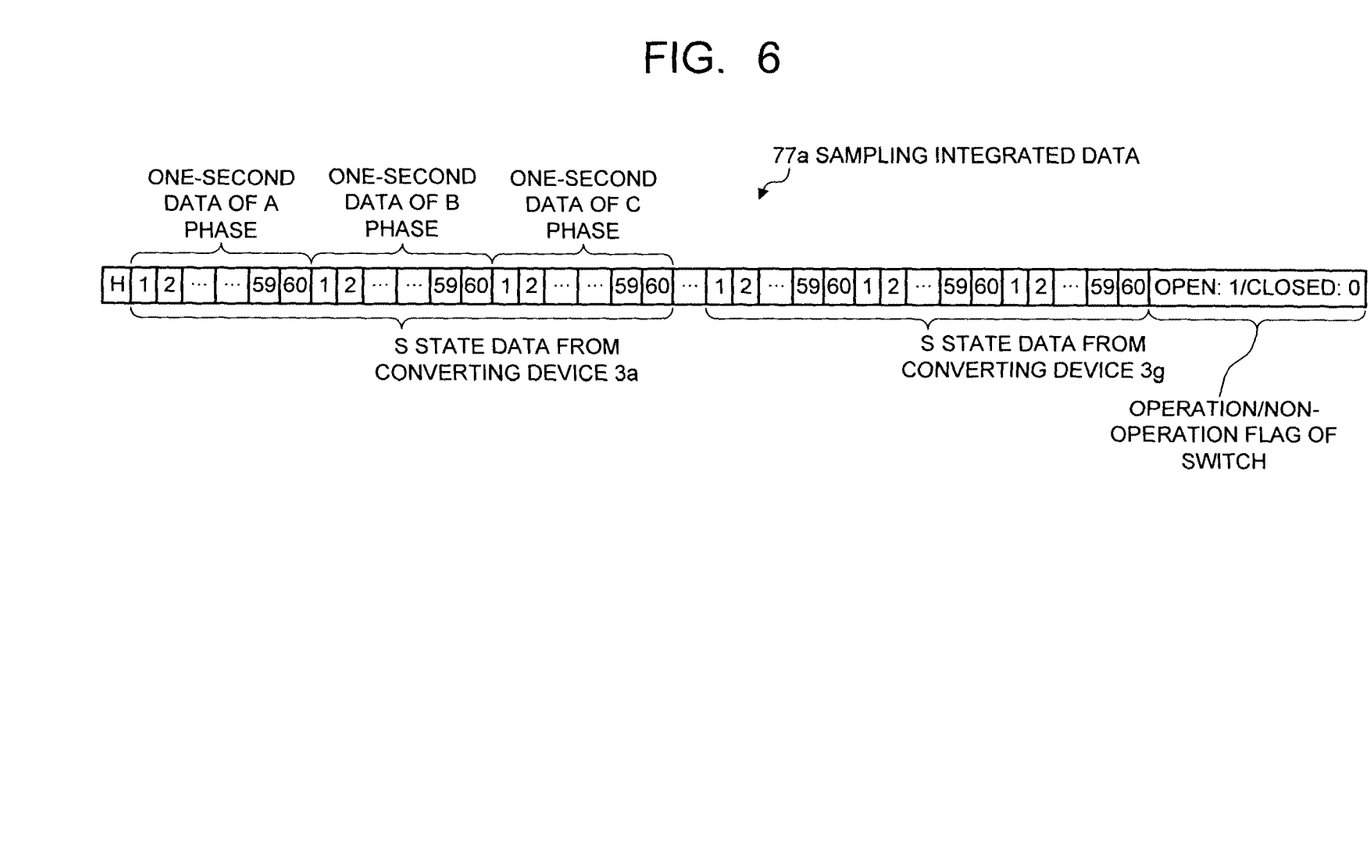
FIG. 6 is a chart illustrating data in a state where the plural state data S are integrated by a data interface device.

The data integrating part 77 associates the plural state data S received from the plural converting devices 3*a* to 3*g* with IDs or the like of the respective sensors and integrates the plural state data S into the sampling integrated data 77*a* (refer to FIG. 6). At this time, the data integrating part 77 also inserts the flag (operation/non-operation flag) indicating the state change from "open" to "close" of the switch, which is notified from the SW signal detecting part 75, into the sampling integrated data 77*a*, and gives the resultant to the data transmitting/receiving part 78. The data transmitting/receiving part 78 transmits the received sampling integrated data 77*a* to the PC 9 via the LAN 8.

In the PC 9, the data transmitting/receiving part 90 receives the sampling integrated data 77*a* from the plural monitoring boards 5 for different voltage classes and gives them to the data processing part 91, and the data processing part 91 processes the received sampling integrated data 77*a* and stores them in the data storage part 92. Here, the processing refers to statistical processing and graphing processing.

Specifically, in the PC 9, the data processing part 91 decomposes the sampling integrated data 77*a* received by the data transmitting/receiving part 90 into the one-second data of each of the sensors 1, and stores the data in the data storage part 92 and also displays the generation pattern of the partial discharge signal on the data display part 93, with the horizontal axis representing the electrical angle 0 to 360° of the voltage.

As a result of the processing in the PC 9, it is possible to well detect at which timing the partial discharge occurring in the defective portion 43 in the metal container 41 of the GIS 40 occurred.

As described above, according to this embodiment, the sampling combined data (state data S) obtained from the plural sensors 1 are relayed and integrated by the data interface device 7 and the integrated data is sent to the PC 9, which makes it possible for the PC 9 side to display a plurality of (many) parts to be monitored by means of the patterns decomposed and visualized based on the generated phases, with the horizontal axis representing the electrical angle 0 to 360° of the voltage and monitor them real-time. Consequently, it is possible to make the system highly functional.

Further, the data interface device 7 detects the AC zero cross timing of the main circuit voltage and transmits it as the zero cross timing data to the converting device 3a at regular time intervals, and the converting device 3a samples the data based on the zero cross timing data, and consequently, it is possible to simplify the whole structure of the system, and in addition, an extension becomes easy, which makes it possible to provide a partial discharge monitoring system with high scalability at low cost.

Further, in this embodiment, the data interface device 7 is provided in each of the monitoring boards 5 for the different power classes, which makes it possible for the single PC 9 to monitor and display the data from the plural monitoring boards 5 (data interface devices 7) via the LAN. Therefore, it is possible to constitute a monitoring system which has the monitoring board 5 for each of substation apparatuses in different voltage classes and monitors the plural monitoring boards 5 collectively. Consequently, it is possible to provide a low-priced and easy-to-use system.

That is, in monitoring a partial discharge occurring in a power transmission/transformation apparatus such as the GIS 40, it is possible to reduce a load to the network by constituting a monitoring system with a simple and low-cost structure and easy scalability and sending data efficiently to the network.

Further, when the sampling integrated data is sent, the SW signal detecting part 75 adds the data indicating that the GIS 40 is in operation to the sampling integrated data for a certain period of time, and therefore, in the PC 9, it is possible to determine whether or not the partial discharge occurring during this period is ascribable to the operation of the GIS 40.

While certain embodiments of the present invention have been described, these embodiments have been presented by way of example only, and are not intended to limit the scope of the inventions. The novel embodiments described herein may be embodied in a variety of other forms; furthermore, various omissions, substitutions and changes may be made without departing from the spirit of the inventions.

The inventions described in the claims and their equivalents are intended to cover such embodiments or modifications as would fall within the scope and spirit of the inventions. For example, in a signal input circuit part of the sensor 1 described in the above-described embodiment, it is also possible to provide a bandpass filter circuit in which two frequency bands are set as passbands.

Further, each of the constituent elements described in the above-described embodiment may be realized by a program installed in a storage such as a hard disk device of a computer, or the function of the present invention may be realized by storing the aforesaid program in a computer-readable electronic media and causing a computer to read the program from the electronic media. The electronic media include, for example, a recording media such as CD-ROM, a flash memory, a removable media, and the like. Further, the function may be realized by storing the constituent elements in a distributed manner in different computers connected to one another via a network and by the computers made to function as the constituent elements communicating with one another.

What is claimed is:

1. A partial discharge monitoring system comprising:
   electromagnetic wave detection sensors disposed in insulating gas enclosures being objects to be monitored to detect electromagnetic waves in the insulating gas enclosures;
   converting devices sampling signals of the electromagnetic waves detected by the electromagnetic wave detection sensors, and converting the signals to digital data; and
   an interface device integrating the digital data generated through the conversion by the converting devices, and transmitting the integrated digital data to a monitoring device,
   wherein the interface device comprises:
      a detecting part detecting a zero cross point of a main circuit voltage signal in phase with a voltage signal applied to conductors disposed in the insulating gas enclosures, and deciding a sampling timing of the signals of the electromagnetic waves;
      a transmitting part notifying the sampling timing decided by the detecting part to the converting devices;
      an integrating part integrating the digital data which are received from the converting devices on per converting device basis; and
      a transmitting part transmitting the digital data integrated by the integrating part to the monitoring device, and
   wherein the converting devices each comprise:
      a timing deciding part deciding a timing when to sample the signal of the electromagnetic wave, based on the sampling timing notified from the interface device;
      a detecting part sampling the signal of the electromagnetic wave based on the timing decided by the timing deciding part, and converting the signal to the digital data; and
      a transmitting part transmitting the digital data generated through the conversion by the detecting part to the interface device.

2. The partial discharge monitoring system according to claim 1,
   wherein the converting devices detect a partial discharge signal at intervals of each segment into which the time period is divided based on the zero cross timing of the phase of the main circuit voltage signal detected by the interface device.

3. The partial discharge monitoring system according to claim 1,
   wherein the interface device integrates the data which are sent from the plural converting devices, into data for each unit time and transmits the integrated data to the monitoring device.

4. The partial discharge monitoring system according to claim 1, wherein a data transmission/reception timing between the interface device and the converting devices is controlled by the interface device.

5. The partial discharge monitoring system according to claim 1,
wherein the interface device is provided for each apparatus to be monitored.

6. The partial discharge monitoring system according to claim 1,
wherein the interface device transmits a pulse signal generated at the zero cross timing of the main circuit voltage signal of one phase to the converting devices at predetermined time intervals.

7. The partial discharge monitoring system according to claim 1,
wherein the converting devices detect the signal of the electromagnetic wave at intervals of each segment into which the time period is divided by a multiple of three based on the zero cross timing of the phase of the main circuit voltage signal detected by the interface device.

8. A partial discharge monitoring method in a partial discharge monitoring system which includes: electromagnetic wave detection sensors disposed in insulating gas enclosures being objects to be monitored to detect electromagnetic waves in the insulating gas enclosures; converting devices sampling signals of the electromagnetic waves detected by the electromagnetic wave detection sensors, and converting the signals to digital data; and an interface device integrating the digital data generated through the conversion by the converting device, and transmitting the integrated digital data to a monitoring device, the method comprising:

detecting a zero cross point of a main circuit voltage signal in phase with a voltage signal applied to conductors disposed in the insulating gas enclosures to decide a sampling timing of the signals of the electromagnetic waves, and notifying the decided sampling timing to the converting devices, the detecting and the notifying being performed by the interface device;

sampling the signals of the electromagnetic waves in the insulating gas enclosures detected by the electromagnetic detection sensors, based on the sampling timing notified from the interface device, and transmitting the sampled digital data to the interface device, the sampling and the transmitting being performed by the converting devices; and integrating the digital data which are received from the converting devices on per converting device basis, and transmitting the integrated digital data to the monitoring device, the integrating and the transmitting being performed by the interface device.

* * * * *